United States Patent
BrightSky et al.

(10) Patent No.: US 8,743,599 B2
(45) Date of Patent: Jun. 3, 2014

(54) APPROACH FOR PHASE CHANGE MEMORY CELLS TARGETING DIFFERENT DEVICE SPECIFICATIONS

(75) Inventors: Matthew J. BrightSky, Essex Junction, VT (US); Roger W. Cheek, Somers, NY (US); Ming-Hsiu Lee, Hsinchu (TW)

(73) Assignee: International Business Machines Corporation, Armonk, NY (US)

( * ) Notice: Subject to any disclaimer, the term of this patent is extended or adjusted under 35 U.S.C. 154(b) by 139 days.

(21) Appl. No.: 13/421,718

(22) Filed: Mar. 15, 2012

(65) Prior Publication Data

US 2013/0242648 A1    Sep. 19, 2013

(51) Int. Cl.
*G11C 11/00*     (2006.01)
*G11C 13/00*     (2006.01)

(52) U.S. Cl.
CPC ................... *G11C 13/0004* (2013.01)
USPC ........... 365/163; 365/148; 365/164; 365/113; 365/107; 257/E45.002; 257/2; 257/E21.068; 257/43

(58) Field of Classification Search
CPC .......... G11C 13/0004; G11C 13/0069; G11C 2013/009; H01L 45/144; H01L 45/1608; H01L 45/1675; H01L 27/24; H01L 45/1246; H01L 27/2472; H01L 45/1641
USPC ................... 365/148, 163, 100, 113
See application file for complete search history.

(56) References Cited

U.S. PATENT DOCUMENTS

| | | | |
|---|---|---|---|
| 6,936,884 B2 | 8/2005 | Chae et al. | 257/315 |
| 7,315,951 B2 | 1/2008 | Hanrieder et al. | 713/300 |
| 7,579,242 B2 | 8/2009 | Bhattacharyya | 438/264 |
| 7,667,259 B2 | 2/2010 | Yasui et al. | 257/314 |
| 2010/0193857 A1 | 8/2010 | Nakagawa | 257/324 |
| 2011/0116308 A1* | 5/2011 | Lung | 365/163 |
| 2012/0170359 A1* | 7/2012 | Wu et al. | 365/163 |

OTHER PUBLICATIONS

Fu, et al. Si-Nanowire Based Gate-All-Around Nonvolatile SONOS Memory Cell. IEEE Electron Device Letters, vol. 29, No. 5, May 2008.

Su, et al. A Nonvolatile InGaZnO Charge-Trapping-Engineered Flash Memory with Good Retention Characteristics. IEEE Electron Device Letters, vol. 31, No. 3, Mar. 2010.

* cited by examiner

*Primary Examiner* — Thong Q Le
(74) *Attorney, Agent, or Firm* — Ido Tuchman; Vazken Alexanian

(57) ABSTRACT

A memory chip and methods of fabricating a memory device with different programming performance and retention characteristics on a single wafer. One method includes depositing a first bounded area of phase change material on the wafer and depositing a second bounded area of phase change material on the wafer. The method includes modifying the chemical composition of a switching volume of the first bounded area of phase change material. The method includes forming a first memory cell in the first bounded area of phase change material with a modified switching volume of phase change material and a second memory cell in the second bounded area of phase change material with an unmodified switching volume of phase change material such that the first memory cell has a first retention property and the second memory cell has a second retention property. The first retention property is different from the second retention property.

21 Claims, 9 Drawing Sheets

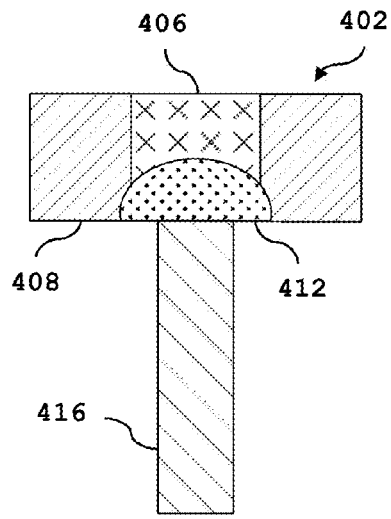
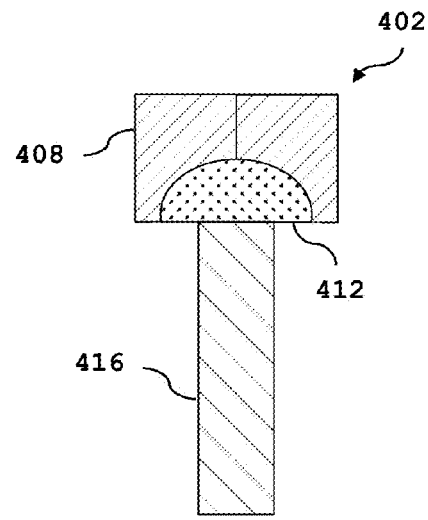
Figure 4A
Figure 4B
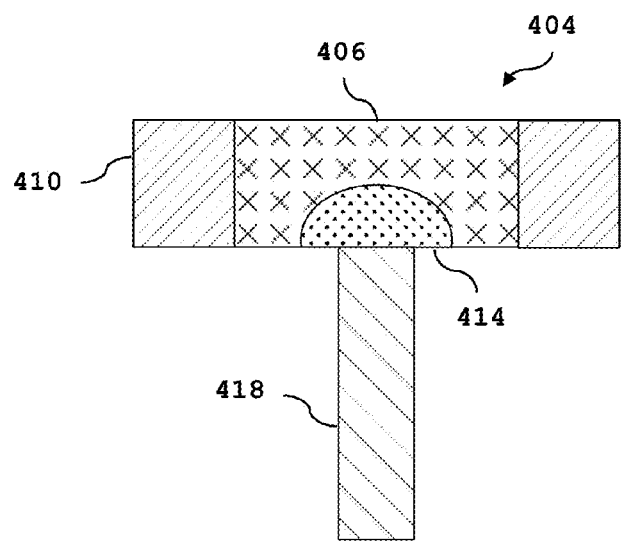
Figure 4C

Smaller GST island, memory core touching the sidewall layer.

Largest GST island, memory core away from the sidewall layer.

APPROACH FOR PHASE CHANGE MEMORY CELLS TARGETING DIFFERENT DEVICE SPECIFICATIONS

BACKGROUND

The present invention relates to memory cells, and more particularly to phase change memory devices and device fabrication.

Memory cells are fabricated in a variety of ways using a large variety of substances. Depending on the material used in the memory cell, the memory cell may be volatile or non-volatile. Volatile memory loses its stored information when there is no applied current or voltage, while non-volatile memory generally retains information without an applied current or voltage. One kind of non-volatile memory is known as phase change memory. Phase change memory cells are often fabricated using phase change materials that have more than one crystalline state, such as chalcogenides or other materials.

In phase change memory, the programming performance may be dominated by how fast the phase change material can be converted from the amorphous phase (RESET state) to the crystalline phase (SET state). The programming operation which converts the high resistance amorphous phase to the low resistance crystalline phase is referred to as the SET operation. Furthermore, the retention of the amorphous phase is governed by the phase change material's ability to avoid unintentional re-crystallization.

BRIEF SUMMARY

An example embodiment of the present invention is a method of fabricating a memory device with different programming performance and retention characteristics on a single wafer. The method includes depositing a first bounded area of phase change material on the wafer and depositing a second bounded area of phase change material on the wafer. The method also includes modifying the chemical composition of a switching volume of the first bounded area of phase change material. The switching volume of phase change material is a volume of phase change material configured to change between amorphous and crystalline phases during operation of the memory device. The method includes forming a first memory cell in the first bounded area of phase change material with a modified switching volume of phase change material. The method also includes forming a second memory cell in the second bounded area of phase change material with an unmodified switching volume of phase change material. The first memory cell and second memory cell are formed such that the first memory cell has a first retention property and first write speed and the second memory cell has a second retention property and second write speed. The first retention property is different from the second retention property, and the first write speed is different from the second write speed.

Another example embodiment of the present invention is another method of fabricating a memory device with different programming performance and retention characteristics on a single wafer. The method includes depositing a phase change material on the wafer. The method also includes patterning a plurality of memory cells in the phase change material. The plurality of memory cells have a first set of memory cells in a first bounded area of phase change material and a second set of memory cells in a second bounded area of the phase change material. Each cell in the plurality of memory cells has a respective section of the phase change material. The first set of memory cells each include a first switching volume in the respective section of the phase change material, and the second set of memory cells each include a second switching volume in the respective section of the phase change material. The first switching volume and the second switching volume are volumes of the phase change material configured to change between amorphous and crystalline phases during operation of the memory device. The method also includes etching the first set of memory cells and the second set of memory cells. The etching is performed such that the chemical composition of the first switching volume of each memory cell of the first set of memory cells is modified and the chemical composition of the second switching volume of each memory cell of the second set of memory cells is unmodified. Each memory cell of the first set of memory cells has a first retention property and a first write speed, and each memory cell of the second set of memory cells has a second retention property and a second write speed. The first retention property is different from the second retention property and the first write speed is different from the second write speed.

A further example embodiment of the invention is a memory chip having memory cells with different programming performance and retention characteristics on a single wafer. The memory chip includes a first set of memory cells in a first bounded area of phase change material. Each memory cell of the first set of memory cells includes a modified switching volume of phase change material. The memory chip includes a second set of memory cells in a second bounded area of phase change material. Each memory cell of the second set of memory cells includes an unmodified switching volume of phase change material. The modified switching volume and the unmodified switching volume are volumes of phase change material configured to change between amorphous and crystalline phases during operation of the memory device. Each memory cell of the first set of memory cells has a first retention property and a first write speed, and the each memory cell of the second set of memory cells has a second retention property and a second write speed. The first retention property is different from the second retention property, and the first write speed is different from a second write speed. The memory chip also includes a substrate including both the first set of memory cells and the second set of memory cells.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIGS. 4A-C show cross-sectional views of example embodiments of a memory cell from the first set of memory cells and an example embodiment of a memory cell from the second set of memory cells.

DETAILED DESCRIPTION

The present invention is described with reference to embodiments of the invention. Throughout the description of the invention reference is made to FIGS. 1-8. As discussed in detail below, embodiments of the present invention include a memory chip with different retention characteristics on a single wafer and methods of fabricating the embodiments of the memory chip and similar memory devices.

In general, embodiments of the invention suggest methods to make memory cells that meet different specifications by controlling the device layout and process condition, without adding new masks. After deposition of the phase change material, a patterning process (generally done by lithography and etching process) may be done to separate the memory layer into groups/islands, at the group size at either single or multiple cells. The etching process (or a special treatment process after etching is done) may modify the material composition on the side walls of the phase change island. This modification may actually change the electrical characteristics of the material and can provide different device specifications. It is noted that there may typically be a tradeoff between retention and programming performance (i.e., SET speed), as the crystallization properties of a material determine both. In most cases, if the phase change material is modified so that the SET speed is faster, this also may result in the retention of the RESET state being worse (the data is lost quicker because the amorphous phase will re-crystallize (unintentionally) faster). The converse may also be true. If the material is modified so that the retention is made better, the SET speed may be slower. Since the depth of the modification may be limited by the etching process (or the treatment process), we can design memory cell characteristics by having the core memory region (or switching volume) involving or not involving the modified region. Embodiments of this fabrication method and the results of this method are described below.

Figure 1:
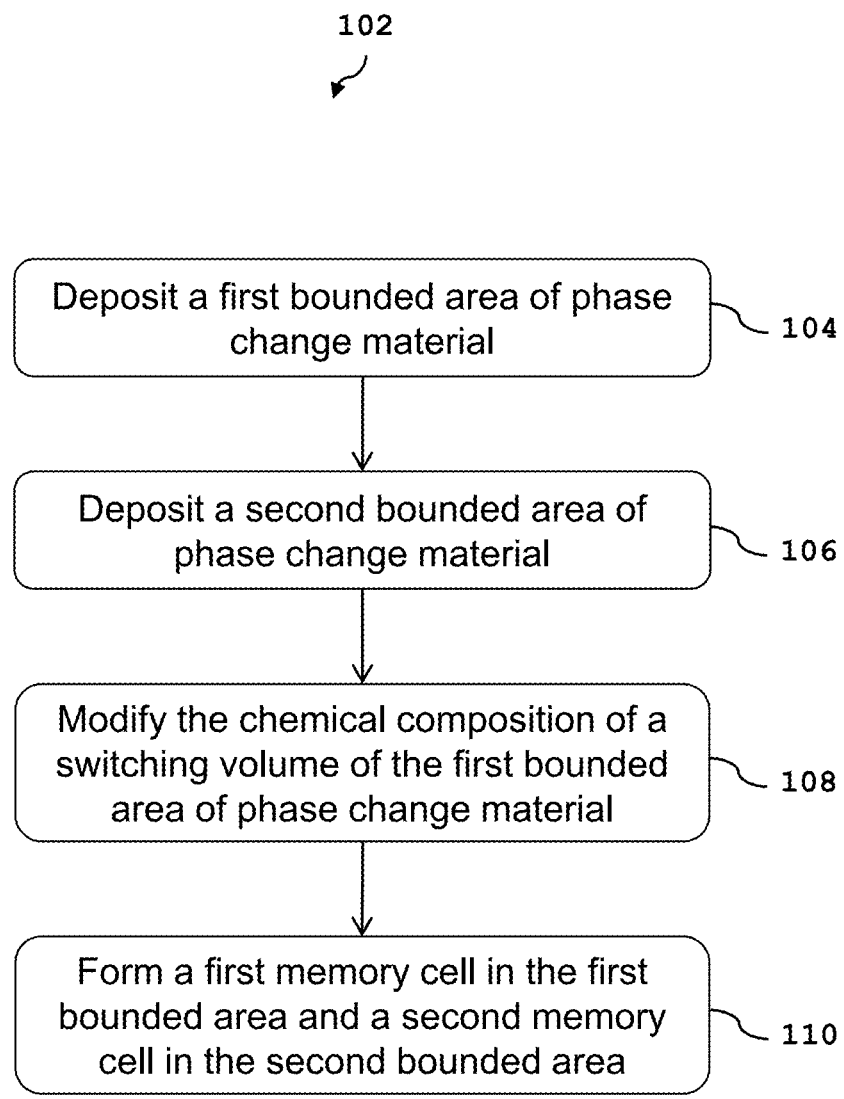
FIG. 1 shows an example embodiment of a method of fabricating a memory device with different programming performance and retention characteristics on a single wafer.

FIG. 1 shows an example embodiment of a method 102 of fabricating a memory device with different programming performance and retention characteristics on a single wafer. The method 102 may include aspects of the method 202 and memory chip 302 described below. The method 102 may include a first depositing step 104 of depositing a first bounded area of phase change material on the wafer and a second depositing step 106 of depositing a second bounded area of phase change material on the wafer. In some embodiments, the first depositing step 104 and second depositing step 106 are performed simultaneously. The first depositing step and second depositing step may be preceded by a bottom electrode forming step of forming one or more bottom electrodes on the wafer. The bottom electrode may be formed of titanium nitride or other suitable material.

The first bounded area of phase change material and second bounded area of phase change material may have the same composition. In one embodiment, the phase change material of the first bounded area and second bounded area is $Ge_2Sb_2Te_5$, but there may be different stoichiometries for germanium, antimony, and tellurium to form suitable phase change materials. Additionally, phase change materials based on other elements may be used. In some embodiments, the phase change material includes one or more dopants such as carbon, nitrogen, oxygen, silicon oxide, silicon nitride, or some other suitable dielectric material or non-conducting material. These dopants may be deposited in the phase change material during the first depositing step 104 and/or second depositing step 106.

In one embodiment, the method 102 includes a composition modifying step 108 of modifying the chemical composition of a switching volume of the first bounded area of phase change material. The switching volume of phase change material is a volume of phase change material configured to change between amorphous and crystalline phases during operation of the memory device. The composition modifying step 108 may include masking a portion of the first bounded area and a portion of the second bounded area of phase change material. The masking is described in further detail below and may be performed prior to etching. Modifying the chemical composition of the switching volume may also include etching side walls of the first bounded area of phase change material and side walls of the second bounded area of phase change material. The etch may be a preferential etch. An example of a reactive ion etch chemistry that may have a suitable preferential etching is a chlorine based reactive ion chemistry. In one embodiment, etching the side walls of the first bounded area of phase change material and the side walls of the second bounded area of phase change material includes performing a reactive ion etch on at least a portion of the first bounded area of phase change material and the second bounded area of phase change material.

During the etch of the side walls of the phase change material some elements may be etched out or diffuse out preferentially. These elements may include the elements of the phase change material or dopants in the phase change material leaving the region. For example, if the phase change material is $Ge_2Sb_2Te_5$, a reactive ion etch chemistry may be chosen that can etch germanium such that when the reactive ion etch is complete, the area at the boundary or side wall of the phase change material will have less germanium than previously. The resulting phase change material in that area may have a faster crystallization speed because the remaining elements such as antimony may crystallize more quickly in the absence of germanium. Sections of the phase change material significantly distant from the etched area at the boundary or side wall may retain the slower crystallization speed of the original unmodified phase change material.

Accordingly, at moderate operating temperatures, if the switching region in the phase change material is sufficiently distant from the etched area (and thus, unaltered by the reactive ion etch), the switching region may crystallize slower than the modified switching region. Thus, when the unmodified switching region is programmed to the amorphous phase it will stay in the amorphous phase longer than the modified switching region. Likewise, the opposite may happen when the side walls and area affected by the reactive ion etch is sufficiently proximate to the electrode and switching region, thereby causing the chemical properties of the switching region to be altered.

In one embodiment, the switching volume is modified if the switching volume touches or is close enough to the side walls such that the modified side walls cause the composition of the switching volume to be altered. For example, with a 30 nm diameter bottom electrode, the switching volume might be a dome of phase change material above the bottom electrode of diameter of roughly 50 nm. In this case, there might be a 10 nm overlap of switching volume on each side of the bottom electrode. If each side wall is about 20 nm from the switching region, then that 20 nm distance might be small enough such that modifying the side walls by a reactive ion etch is enough to affect the switching properties of the device by altering the composition of the switching material. This switching volume, though not necessarily directly etched by the reactive ion etch might be modified when the modified composition of the side walls inter-diffuses with the switching volume or otherwise alters the chemical composition of the switching volume.

In one embodiment, the method 102 includes a memory cell forming step 110 of forming a first memory cell in the first bounded area of phase change material with a modified switching volume of phase change material. The memory cell forming step 110 may also include forming a second memory cell in the second bounded area of phase change material with an unmodified switching volume of phase change material. The first memory cell and second memory cell may be formed such that the first memory cell has a first retention property and the second memory cell has a second retention property. The first retention property may be different from the second retention property. For example, the first retention property may include a first retention time and the second retention property may include a second retention time. In one embodiment the first retention time measures a first length of time over which the first memory cell is capable of storing data. Similarly, the second retention time may measure a second length of time over which the second memory cell is capable of storing data.

The second retention time may be different than the first retention time. In one embodiment, the first retention time is substantially shorter than the second retention time. Additionally, the first memory cell may be formed such that it has a first write speed, and the second memory cell may be formed such that it has a second write speed. The first write speed may be different than the second write speed. The first write speed and second write speed may be speeds required to perform a SET and/or RESET operation on a memory cell. In one embodiment, the first write speed is substantially faster than the second write speed. For example, if the first memory cell has a switching volume with less of an element of the phase change material, such as germanium, or less of a dopant, such as silicon oxide, than the switching volume of the second memory cell, the first memory cell may retain information for less time and/or allow a shorter write speed.

In one embodiment, the first memory cell in the first bounded area of phase change material has a first ratio of the switching volume of phase change material to a first peripheral volume of phase change material. Similarly, the second memory cell in the second bounded area of phase change material may have a second ratio of the switching volume of phase change material to a second peripheral volume of phase change material. The first ratio may be different than the second ratio. The first peripheral volume of phase change material and the second peripheral volume of phase change material may be volumes of phase change material configured not to change between amorphous and crystalline phases during operation of the memory device. For example, all the volume of the first bounded area of phase change material that is not part of the switching volume may be the first peripheral volume. In one embodiment, the first ratio is greater than 1.0, and the second ratio is less than 0.5. Additionally, the modified switching volume of the first memory cell may be spaced closer to side walls of the first bounded area of the phase change material than the switching volume of the second memory cells is spaced to side walls of the second bounded area of the phase change material.

In one embodiment, the first memory cell includes a respective first base electrode below the modified switching volume and the second memory cell includes a respective second base electrode below the unmodified switching volume.

Figure 2:
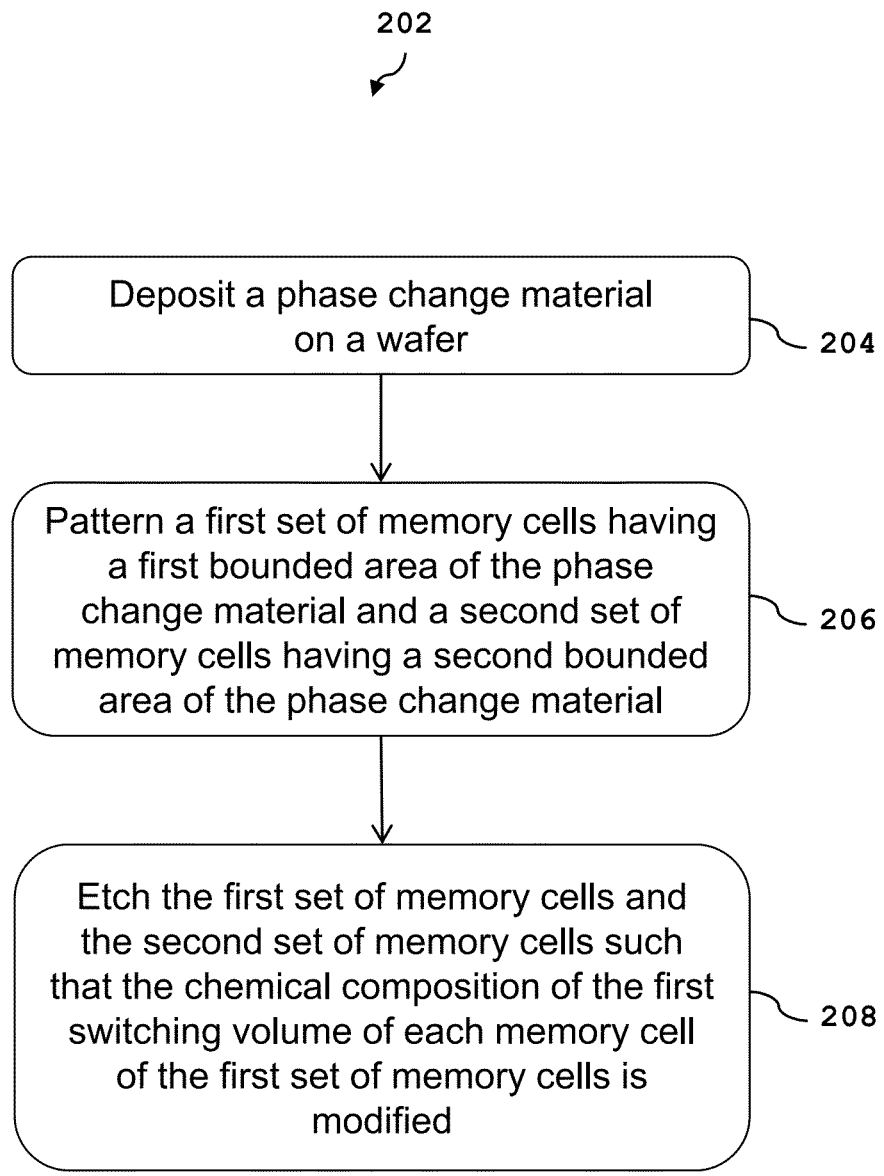
FIG. 2 shows an example embodiment of another method of fabricating a memory device with different programming performance and retention characteristics on a single wafer.

FIG. 2 shows an example embodiment of another method 202 of fabricating a memory device with different programming performance and retention characteristics on a single wafer. In some embodiments, method 202 includes aspects of method 102 described above. The method 202 may include a material depositing step 204 of depositing a phase change material on the wafer. In one embodiment, the method includes a memory cell patterning step 206 of patterning a plurality of memory cells in the phase change material. In one embodiment, the plurality of memory cells are only partially fabricated memory cells, i.e., the memory cells may require additional fabrication steps to become ready for use. The memory cells may be patterned as shown below in FIGS. 5 and 6. The plurality of memory cells may include a first set of memory cells in a first bounded area of the phase change material and a second set of memory cells in a second bounded area of the phase change material. In one embodiment, each cell in the plurality of memory cells has a respective section of the phase change material. The first set of memory cells each may include a first switching volume in the respective section of the phase change material, and the second set of memory cells each may include a second switching volume in the respective section of the phase change material. The first switching volume and the second switching volume are volumes of the phase change material configured to change between amorphous and crystalline phases during operation of the memory device.

In one embodiment, the method 202 includes a memory cell etching step 208 of etching the first set of memory cells and the second set of memory cells. The etch may be performed such that the chemical composition of the first switching volume of each memory cell of the first set of memory cells is modified and the chemical composition of the second switching volume of each memory cell of the second set of memory cells is unmodified. In one embodiment, etching the first set of memory cells and the second set of memory cells includes etching side walls of the first bounded area of the phase change material and side walls of the second bounded area of the phase change material. For example, etching the side walls of the first bounded area of the phase change material and the side walls of the second bounded area of the phase change material may include performing a reactive ion etch on at least a portion of the first bounded area of phase change material and the second bounded area of phase change material. In one embodiment, the memory cell etching step 208 includes etching as described in detail for method 102 above.

The memory cell etching step 208 may include masking the plurality of memory cells such that side walls of the first bounded area and side walls of the second bounded area are modified during the etch. In one embodiment, a titanium nitride top electrode is formed above the phase change material of the first bounded area and second bounded area. In order to etch the stack of the top electrode and phase change material, a mask may be used such as a photo resist, silicon nitride hard mask, or a silicon dioxide hard mask. In areas unprotected by the mask, dopants in the side walls of the first bounded area and side walls in the second bounded area may be etched out or otherwise leave the first bounded area and second bounded area. In another embodiment, elements of the phase change material in the first bounded area and second bounded area are selectively etched out of the phase change material. In one embodiment, the only one masking step is used to simultaneously mask both the first bounded area and second bounded area.

In one embodiment, each memory cell of the first set of memory cells in the first bounded area of the phase change material has a first ratio of the first switching volume to a first peripheral volume of the phase change material. Similarly, each memory cell of the second set of memory cells in the second bounded area of the phase change material may have a second ratio of the second switching volume to a second peripheral volume of the phase change material. In one embodiment, the first ratio is different than the second ratio. For example, the first ratio may be greater than 1.0, and the second ratio may be less than 0.5. The first peripheral volume of the phase change material and the second peripheral volume of the phase change material may be volumes of the phase change material configured not to change between amorphous and crystalline phases during operation of the memory device. For example, all the volume of the first bounded area of phase change material that is not part of the first switching volume may be the first peripheral volume. In one embodiment, the first switching volume of each memory cell of the first set of memory cells may be spaced closer to side walls of the first bounded area of the phase change material than the second switching volume of each memory cell of the second set of memory cells is spaced to side walls of the second bounded area of the phase change material.

In one embodiment, each memory cell of the first set of memory cells has a first retention property, and each memory cell of the second set of memory cells may have a second retention property. The first retention property may be different from the second retention property. In one embodiment, the first retention property includes a first retention time measuring a first length of time over which a memory cell from the first set of memory cells is capable of storing data. Additionally, the second retention property may include a second retention time measuring a second length of time over which a memory cell from the second set of memory cells is capable of storing data. The second retention time is different than the first retention time. In one embodiment, the first retention time is substantially shorter than the second retention time. Additionally, each memory cell of the first set of memory cells may be formed such that it has a first write speed, and each memory cell of the second set of memory cells may be formed such that it has a second write speed. The first write speed may different from the second write speed. The first write speed and second write speed may be speeds required to perform a SET and/or RESET operation on a memory cell. In one embodiment, the first write speed is substantially faster than the second write speed.

In one embodiment, each memory cell of the first set of memory cells includes a respective first base electrode below the first switching volume, and each memory cell of the second set of memory cells includes a respective second base electrode below the second switching volume.

Figure 3:
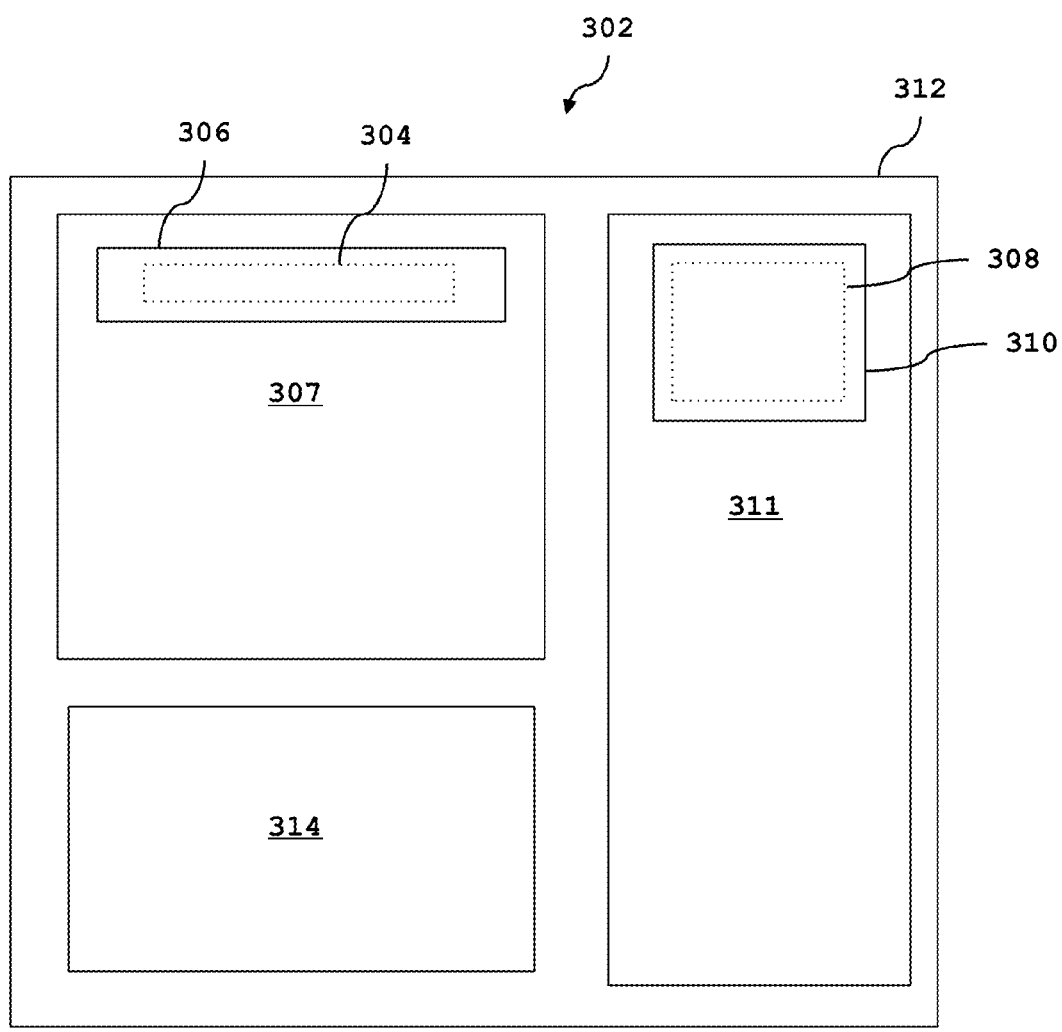
FIG. 3 shows an abstract depiction of top-down view of an example embodiment of a memory chip having memory cells with different programming performance and retention characteristics on a single wafer.

FIG. 3 shows an abstract depiction of a top-down view of an example embodiment of a memory chip 302 having memory cells with different programming performance and retention characteristics on a single wafer. The memory chip may be formed by the methods described above or variations thereof. The memory chip 302 may include a first set of memory cells 304 in a first bounded area 306 of phase change material. The first bounded area 306 of phase change material may be located in a first memory region 307. The memory chip 302 may also include a second set of memory cells 308 in a second bounded area 310 of phase change material. The second bounded area 310 of phase change material may be located in a second memory region 311. In one embodiment, the first memory region 307 includes a plurality of first bounded areas 306 of phase change material. The second memory region 311 may also include a plurality of second bounded areas 310 of phase change material. A variety of patterns and configurations for the first bounded areas 306 of phase change material and second bounded areas 310 of phase change material may be used according to the design requirements of the memory chip 302. It is noted that embodiments of the first set of memory cells 304 and second set of memory cells 308 are shown in greater detail in FIGS. 5 and 6, and embodiments of individual memory cells from the first set of memory cells 304 and second set of memory cells 308 are shown in FIGS. 4A-C. The memory chip 302 may also include a substrate 312 including both the first set of memory cells 304 and the second set of memory cells 308. In one embodiment, the memory chip 302 also includes logic circuits 314 configured to facilitate access to the first set of memory cells 304 and second set of memory cells 308.

FIGS. 4A-C show cross-sectional views of example embodiments of a memory cell from the first set of memory cells and an example embodiment of a memory cell from the second set of memory cells. Specifically, FIGS. 4A-B show cross-sectional views of embodiments of a memory cell 402 from the first set of memory cells, and FIG. 4C shows a cross-sectional view of an embodiment of a memory cell 404 from the second set of memory cells. Though memory cells 402 and 404 are shown in a mushroom cell configuration (also known as a heater cell or pin cell configuration), embodiments of the invention are not limited to this configuration. In one embodiment, the first set of memory cells and second set of memory cells each include phase change material 406. The phase change material of each memory cell of the first set of memory cells may include a first set of side walls 408. Similarly, the phase change material of each memory cell of the second set of memory cells may include a second set of side walls 410.

Each memory cell 402 of the first set of memory cells may include a modified switching volume 412 of phase change material, and each memory cell of the second set of memory cells may include an unmodified switching volume 414 of phase change material. The modified switching volume 412 and the unmodified switching volume 414 are volumes of phase change material 406 configured to change between amorphous and crystalline phases during operation of the memory device. Additionally, each memory cell 402 of the first set of memory cells may include a respective first base electrode 416 below the modified switching volume, and each memory cell of the second set of memory cells may include a respective second base electrode 418 below the unmodified switching volume. In one embodiment, the chemical composition of the modified switching volume includes the same chemical elements of the chemical composition of the unmodified switching volume but with one or more of the chemical elements in the modified switching volume in a higher or lower concentration than the same chemical elements of the unmodified switching volume.

In one embodiment, the first set of memory cells has a first retention property and the second set of memory cells has a second retention property. The first retention property may be different from the second retention property. For example, the first retention property may include a first retention time, and the second retention property may include a second retention time. The first retention time may measure a first length of time over which a memory cell from the first set of memory cells is capable of storing data, and the second retention time may measure a second length of time over which a memory cell from the second set of memory cells is capable of storing data. In one embodiment, the second retention time is different than the first retention time. In one embodiment, the first retention time is shorter than the second retention time. Additionally, each memory cell of the first set of memory cells may be formed such that it has a first write speed, and each memory cell of the second set of memory cells may be formed such that it has a second write speed. The first write speed may be different from the second write speed. The first write speed and second write speed may be speeds required to perform a SET and/or RESET operation on a memory cell. In one embodiment, the first write speed is substantially faster than the second write speed.

In one embodiment, each memory cell 402 of the first set of memory cells in the first bounded area of phase change material has a first ratio of the modified switching volume of phase change material to a first peripheral volume of phase change material. Similarly, each memory cell of the second set of memory cells in the second bounded area of phase change material may have a second ratio of the unmodified switching volume of phase change material to a second peripheral volume of phase change material. In one embodiment, the first ratio is different than the second ratio. For example, the first ratio may be greater than 1.0, and the second ratio may be less than 0.5. The first peripheral volume of phase change material and the second peripheral volume of phase change material are volumes of phase change material configured not to change between amorphous and crystalline phases during operation of the memory device. For example, all the volume of the first bounded area of phase change material that is not part of the modified switching volume may be the first peripheral volume.

In one embodiment, the modified switching volume of each memory cell of the first set of memory cells is closer to side walls of the first bounded area of phase change material than the unmodified switching volume of each memory cell of the second set of memory cells is spaced to side walls of the second bounded area of phase change material.

FIG. 4B shows a cross-sectional view of another example embodiment of a memory cell 402 from the first set of memory cells. The example embodiment memory cell shown in FIG. 4B may include similar features as example embodiment memory cell 402 shown in FIG. 4A. The first set of side walls of memory cell 402 shown in FIG. 4B, however, may be spaced substantially closer to each other than the side walls of the memory cell shown in FIG. 4A. This spacing may depend on the size of the first bounded area in which the memory cell resides. Accordingly, a variety of configurations are contemplated in order to meet the design needs of various embodiments of memory cells.

FIGS. 5 and 6 illustrate that in an embedded system or memory system that requires both high speed cells (where data retention is not first priority) and long retention cells (where the speed is not first priority), the designer can design cells in small islands or narrow lines to make the memory core touching the modified region to get high speed cells, and large islands or wide lines or common plates for cells need good data retention.

Figure 5A:
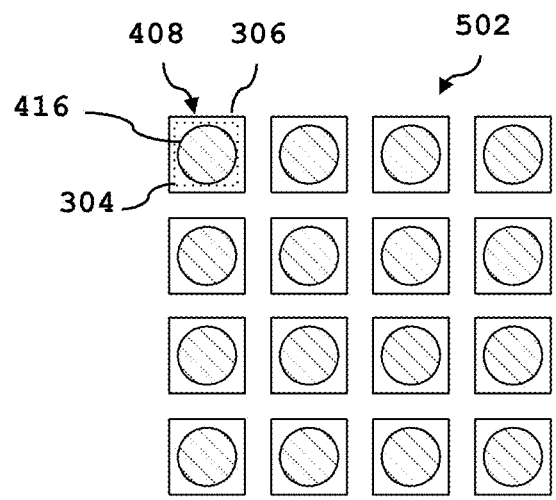
FIGS. 5A-B show top-down cross-sectional views of example embodiments of the first set of memory cells and example embodiments of the second set of memory cells, each arranged on noncontiguous sections of phase change material.
Figure 5B:
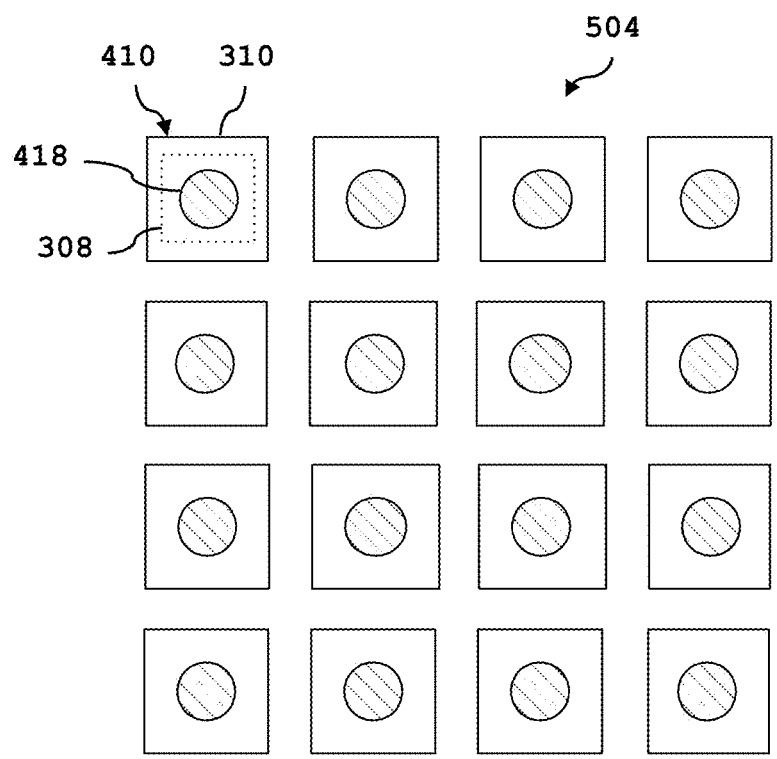

FIGS. 5A and B show top-down cross-sectional views of example embodiments of the first set of memory cells and example embodiments of the second set of memory cells, each arranged on noncontiguous sections of phase change material. Specifically, FIG. 5A shows an example embodiment of the first set of memory cells, and FIG. 5B shows an example embodiment of the second set of memory cells. It is noted for clarity of illustration, some elements of the memory cells may not be shown in FIGS. 5-6. In these example embodiments, the first set of memory cells includes only one cell, and the second set of memory cells includes only one cell. In one embodiment, the first set of memory cells is aligned in a first grid 502 and the second set of memory cells is aligned in a second grid 504.

Figure 6A:
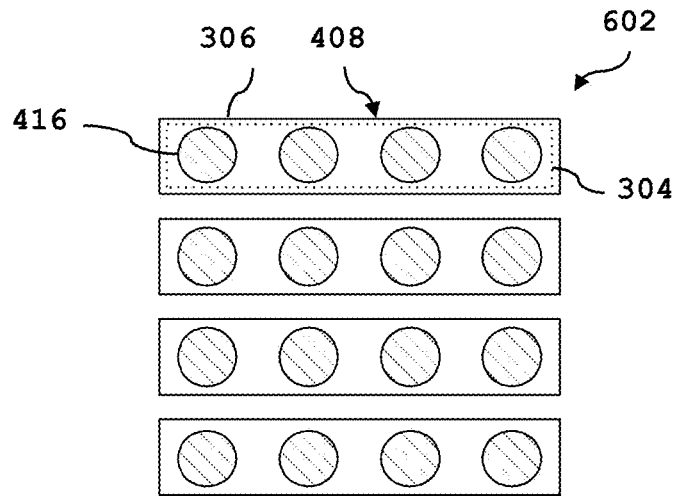
FIGS. 6A-C show top-down cross-sectional views of example embodiments of the first set of memory cells and example embodiments of the second set of memory cells, each arranged on contiguous sections of phase change material.
Figure 6B:
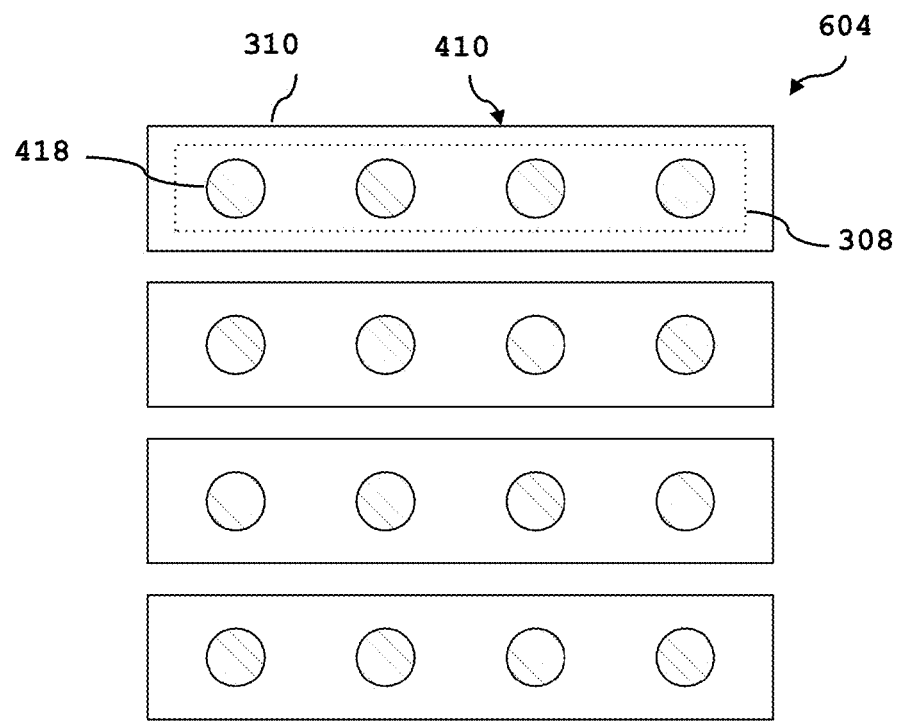
Figure 6C:
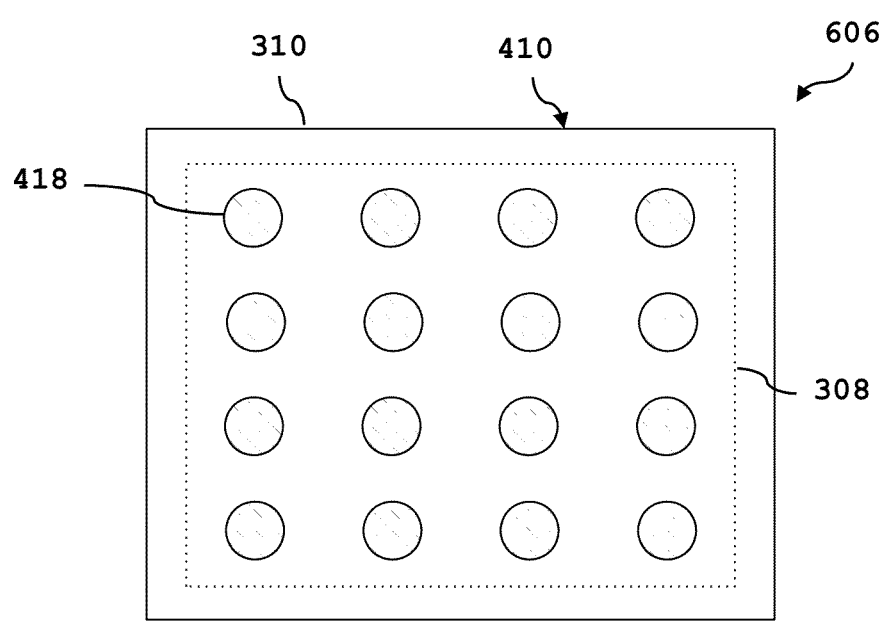

FIGS. 6A-C show top-down cross-sectional views of example embodiments of the first set of memory cells and example embodiments of the second set of memory cells, each arranged on contiguous sections of phase change material. Specifically, FIG. 6A shows an example embodiment of the first set of memory cells arranged in a first set of rows 602 of phase change material, FIG. 6B shows an example embodiment of the second set of memory cells arranged in a second set of rows 604 of phase change material, and FIG. 6C shows another example embodiment of the second set of memory cells arranged on a plate 606 of phase change material.

Figure 7A:
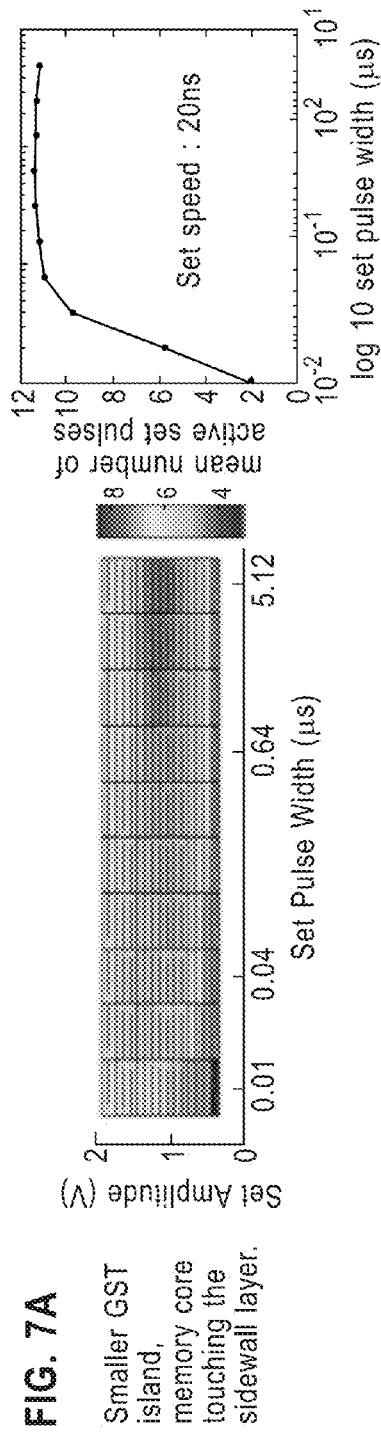
FIGS. 7A-B show graphs from an experiment measuring the set speed of example memory cells.
Figure 7B:
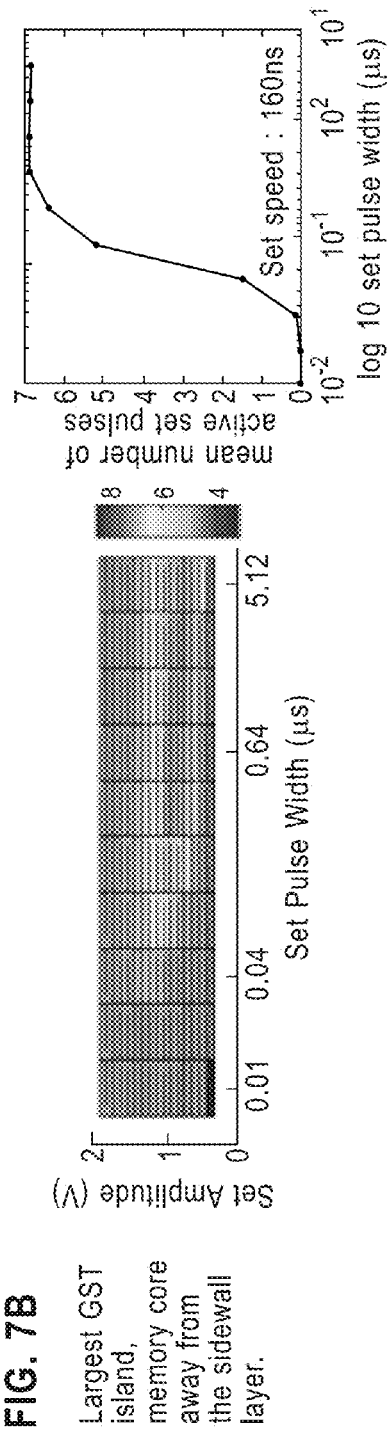

FIGS. 7A and B show graphs from an experiment measuring the set speed of example memory cells. Specifically, FIG. 7A shows a graph measuring the set speed of a memory cell of the first set of memory cells, and FIG. 7B shows a graph measuring the set speed of a memory cell of the second set of memory cells. The vertical axis is the amplitude of a set pulse, and the horizontal axis is the width of set pulse. The shading indicates the resistance in log scale ohms, i.e., the number 4 on the scale represents ten kiloohms and the number 6 represents 1 megaohms. When the darker shade is achieved, the memory cell may be set to the desired state. FIGS. 7A-B also show the amount of time taken to get the memory cells to achieve the desired state. Comparison of the graphs indicates faster write speed in FIG. 7A than FIG. 7B.

Figure 8:
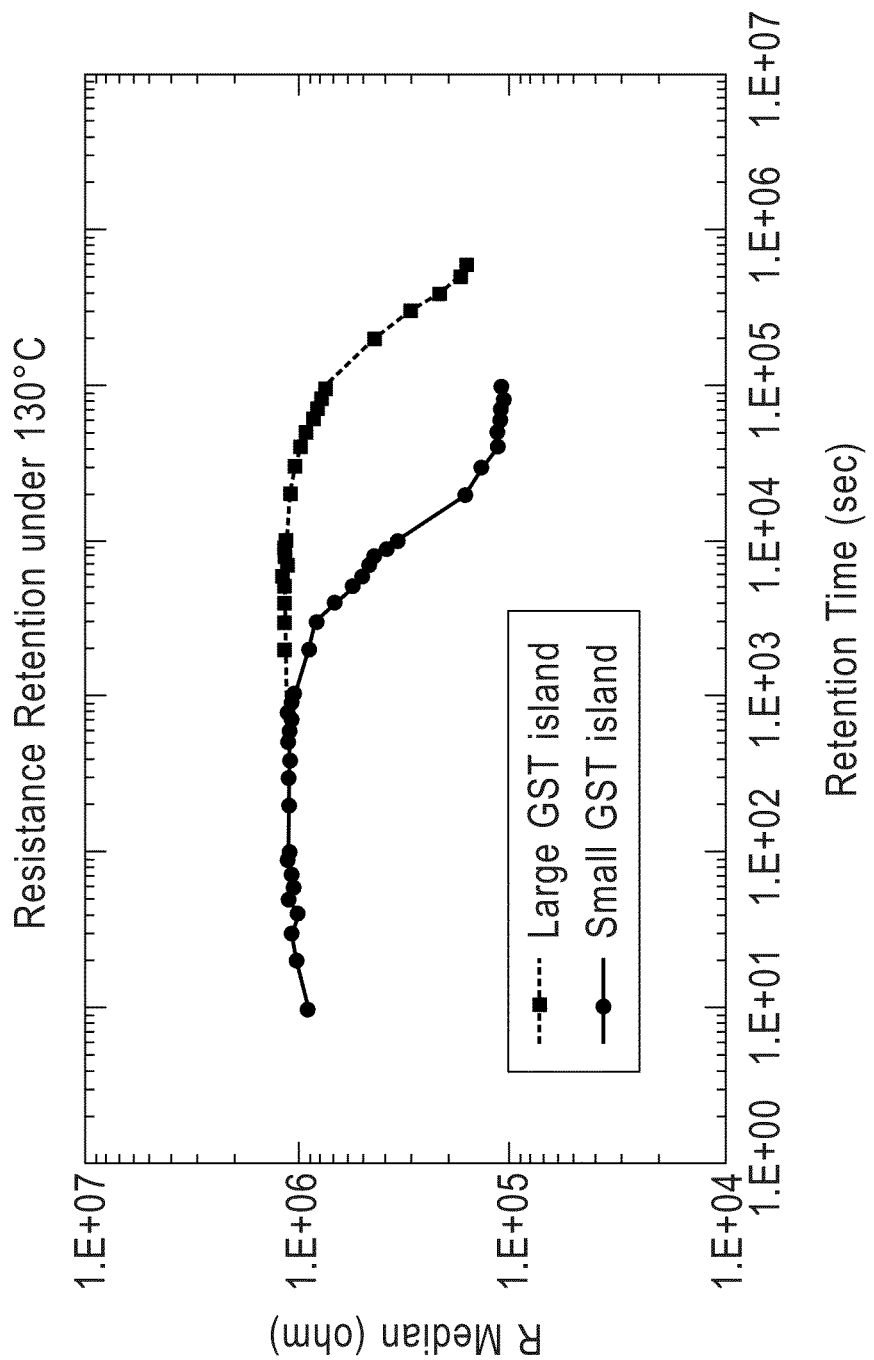
FIG. 8 shows a graph of an experiment depicting the resistance over time of an example memory cell with a modified switching volume and an example memory cell with an unmodified switching volume.

FIG. 8 shows a graph of an experiment depicting the resistance over time of an example memory cell with a modified switching volume and an example memory cell with an unmodified switching volume. In the experiment, each cell is programmed into the high resistance state, approximately 1 megaohm, and held at 130 degrees Celsius. The resistance is read as a function of time on the horizontal axis. At around a thousand seconds, the curve representing the memory cell with the modified switching volume shows a decrease in resistance. At a later time, things start to the change for the curve representing the memory cell with the unmodified switching volume. In general, the experiment shows that as time progresses, the resistance begins to drop, but the resistance begins to drop sooner for the smaller bounded area (which contains the modified switching area) than for the larger bounded area (which contains the unmodified switching area) of phase change material. Thus, the retention is better for the memory cell with the unmodified switching volume because the state is maintained for a longer duration for the larger phase change material island.

While the preferred embodiments to the invention have been described, it will be understood that those skilled in the art, both now and in the future, may make various improvements and enhancements that fall within the scope of the claims which follow. These claims should be construed to maintain the proper protection for the invention first described.

What is claimed is:

1. A method of fabricating a memory device with different programming performance and retention characteristics on a single wafer, the method comprising:
    depositing a first bounded area of phase change material on the wafer;
    depositing a second bounded area of phase change material on the wafer;
    modifying the chemical composition of a switching volume of the first bounded area of phase change material, the switching volume of phase change material is a volume of phase change material configured to change between amorphous and crystalline phases during operation of the memory device; and
    forming a first memory cell in the first bounded area of phase change material with a modified switching volume of phase change material and a second memory cell in the second bounded area of phase change material with an unmodified switching volume of phase change material such that the first memory cell has a first retention property and a first write speed and the second memory cell has a second retention property and a second write speed, wherein the first retention property is different from the second retention property and the first write speed is different from the second write speed; and
    wherein modifying the chemical composition of the switching volume includes etching side walls of the first bounded area of phase change material and side walls of the second bounded area of phase change material.

2. The method of claim 1, wherein etching the side walls of the first bounded area of phase change material and the side walls of the second bounded area of phase change material includes performing a reactive ion etch on at least a portion of the first bounded area of phase change material and the second bounded area of phase change material.

3. The method of claim 1, further comprising:
    wherein the first memory cell in the first bounded area of phase change material has a first ratio of the switching volume of phase change material to a first peripheral volume of phase change material; and
    wherein the second memory cell in the second bounded area of phase change material has a second ratio of the switching volume of phase change material to a second peripheral volume of phase change material, the first ratio is different than the second ratio, the first peripheral volume of phase change material and the second peripheral volume of phase change material are volumes of phase change material configured not to change between amorphous and crystalline phases during operation of the memory device.

4. The method of claim 3, wherein the first ratio is greater than 1.0 and the second ratio is less than 0.5.

5. The method of claim 1, wherein the modified switching volume of the first memory cell is spaced closer to side walls of the first bounded area of phase change material than the switching volume of the second memory cells is spaced to side walls of the second bounded area of the phase change material.

6. The method of claim 1, wherein the first memory cell includes a respective first base electrode below the modified switching volume and the second memory cell includes a respective second base electrode below the unmodified switching volume.

7. The method of claim 1, wherein the first retention property includes a first retention time measuring a first length of time over which the first memory cell is capable of storing data and the second retention property includes a second retention time measuring a second length of time over which the second memory cell is capable of storing data, wherein the second retention time is different than the first retention time.

8. A method of fabricating a memory device with different programming performance and retention characteristics on a single wafer, the method comprising:
    depositing a phase change material on the wafer;
    patterning a plurality of memory cells in the phase change material, the plurality of memory cells having a first set of memory cells in a first bounded area of the phase change material and a second set of memory cells in a second bounded area of the phase change material, the plurality of memory cells each having a respective section of the phase change material, the first set of memory cells each including a first switching volume in the respective section of the phase change material, the second set of memory cells each including a second switching volume in the respective section of the phase change material, the first switching volume and the second switching volume are volumes of the phase change material configured to change between amorphous and crystalline phases during operation of the memory device; and
    etching the first set of memory cells and the second set of memory cells such that the chemical composition of the first switching volume of each memory cell of the first set of memory cells is modified and the chemical composition of the second switching volume of each memory cell of the second set of memory cells is unmodified, wherein each memory cell of the first set of memory cells has a first retention property and a first write speed and each memory cell of the second set of memory cells has a second retention property and a second write speed, wherein the first retention property is different from the second retention property and the first write speed is different from the second write speed; and
    wherein etching the first set of memory cells and the second set of memory cells includes etching side walls of the first bounded area of the phase change material and side walls of the second bounded area of the phase change material.

9. The method of claim 8, wherein etching the side walls of the first bounded area of the phase change material and the side walls of the second bounded area of the phase change material includes performing a reactive ion etch on at least a portion of the first bounded area of phase change material and the second bounded area of phase change material.

10. The method of claim 8, further comprising:
    wherein each memory cell of the first set of memory cells in the first bounded area of the phase change material has a first ratio of the first switching volume to a first peripheral volume of the phase change material; and
    wherein each memory cell of the second set of memory cells in the second bounded area of the phase change material has a second ratio of the second switching volume to a second peripheral volume of the phase change material, the first ratio is different than the second ratio, the first peripheral volume of the phase change material and the second peripheral volume of the phase change material are volumes of the phase change material configured not to change between amorphous and crystalline phases during operation of the memory device.

11. The method of claim 10, wherein the first ratio is greater than 1.0 and the second ratio is less than 0.5.

12. The method of claim 8, wherein the first switching volume of each memory cell of the first set of memory cells is spaced closer to side walls of the first bounded area of the phase change material than the second switching volume of each memory cell of the second set of memory cells is spaced to side walls of the second bounded area of the phase change material.

13. The method of claim 8, wherein each memory cell of the first set of memory cells includes a respective first base electrode below the first switching volume and each memory cell of the second set of memory cells includes a respective second base electrode below the second switching volume.

14. The method of claim 8, wherein the first retention property includes a first retention time measuring a first length of time over which a memory cell from the first set of memory cells is capable of storing data and the second retention property includes a second retention time measuring a second length of time over which a memory cell from the second set of memory cells is capable of storing data, wherein the second retention time is different than the first retention time.

15. A memory chip having memory cells with different programming performance and retention characteristics on a single wafer, the memory chip comprising:
   a first set of memory cells in a first bounded area of phase change material, each memory cell of the first set of memory cells including a modified switching volume of phase change material;
   a second set of memory cells in a second bounded area of phase change material, each memory cell of the second set of memory cells including an unmodified switching volume of phase change material, the modified switching volume and the unmodified switching volume are volumes of phase change material configured to change between amorphous and crystalline phases during operation of the memory device, wherein the each memory cell of the first set of memory cells has a first retention property and a first write speed and each memory cell of the second set of memory cells has a second retention property and a second write speed, wherein the first retention property is different from the second retention property and the first write speed is different from the second write speed; and
   a substrate including both the first set of memory cells and the second set of memory cells; and
   wherein each memory cell of the first set of memory cells in the first bounded area of phase change material has a first ratio of the modified switching volume of phase change material to a first peripheral volume of phase change material; and wherein each memory cell of the second set of memory cells in the second bounded area of phase change material has a second ratio of the unmodified switching volume of phase change material to a second peripheral volume of phase change material, the first ratio is different than the second ratio, the first peripheral volume of phase change material and the second peripheral volume of phase change material are volumes of phase change material configured not to change between amorphous and crystalline phases during operation of the memory device.

16. The memory chip of claim 15, wherein the first ratio is greater than 1.0 and the second ratio is less than 0.5.

17. The memory chip of claim 15, wherein the modified switching volume of each memory cell of the first set of memory cells is closer to side walls of the first bounded area of phase change material than the unmodified switching volume of each memory cell of the second set of memory cells is spaced to side walls of the second bounded area of phase change material.

18. The memory chip of claim 15, wherein the first set of memory cells is aligned in a first grid and the second set of memory cells is aligned in a second grid.

19. The memory chip of claim 15, wherein each memory cell of the first set of memory cells includes a respective first base electrode below the modified switching volume and each memory cell of the second set of memory cells includes a respective second base electrode below the unmodified switching volume.

20. The memory chip of claim 15, wherein the first retention property includes a first retention time measuring a first length of time over which a memory cell from the first set of memory cells is capable of storing data and the second retention property includes a second retention time measuring a second length of time over which a memory cell from the second set of memory cells is capable of storing data, wherein the second retention time is different than the first retention time.

21. The memory chip of claim 15, wherein the chemical composition of the modified switching volume includes the same chemical elements of the chemical composition of the unmodified switching volume but with one or more of the chemical elements in the modified switching volume in a higher or lower concentration than the same chemical elements of the unmodified switching volume.

* * * * *